United States Patent [19]
Kinzer

[11] Patent Number: 6,144,067
[45] Date of Patent: Nov. 7, 2000

[54] STRIP GATE POLY STRUCTURE FOR INCREASED CHANNEL WIDTH AND REDUCED GATE RESISTANCE

[75] Inventor: Daniel M. Kinzer, El Segundo, Calif.

[73] Assignee: International Rectifier Corp., El Segundo, Calif.

[21] Appl. No.: 09/197,939

[22] Filed: Nov. 23, 1998

[51] Int. Cl.[7] .............................. H01L 29/76; H01L 29/94
[52] U.S. Cl. .......................... 257/335; 257/341; 257/342
[58] Field of Search .................................... 257/335, 341, 257/342

[56] References Cited

U.S. PATENT DOCUMENTS

| | | | |
|---|---|---|---|
| 4,677,452 | 6/1987 | Zommer | 257/341 |
| 4,833,513 | 5/1989 | Sasaki | 257/342 |
| 5,399,892 | 3/1995 | Neilson et al. | 257/341 |
| 5,521,410 | 5/1996 | Yamamoto | 257/342 |
| 5,631,484 | 5/1997 | Tsoi et al. | 257/341 |
| 5,703,389 | 12/1997 | Knoch et al. | 257/327 |

*Primary Examiner*—John Guay
*Attorney, Agent, or Firm*—Ostrolenk, Faber, Gerb & Soffen, LLP

[57] ABSTRACT

A MOSgated device has a plurality of rows of closed cells which each have a laterally enlarged central base area having two narrow oppositely extending base stripes. Each cell in the row is spaced from the adjacent cell in the row, and each cell of one row is nested into the cells of an opposite row such that its enlarged central region is longitudinally located adjacent the space between the cells of the adjacent row. The polysilicon gate is a continuous sheet and permits gate current to spread both longitudinally and laterally. The invention can be carried out with planar and groove technologies.

28 Claims, 5 Drawing Sheets

6,144,067

STRIP GATE POLY STRUCTURE FOR INCREASED CHANNEL WIDTH AND REDUCED GATE RESISTANCE

BACKGROUND OF THE INVENTION

This invention relates to power MOSgated devices and more specifically relates to a novel structure having an increased channel width per unit area and a reduced polysilicon gate resistance.

Power MOSgated devices are well known and may be power MOSFETs, IGBTs, GTOs and other devices using a MOSgate for conduction control. At low voltages, a topology has been used in which a plurality of elongated base stripes which contain source regions form vertical conduction channels which conduct when the channel regions defined by the sources within their respective bases are inverted by a MOSgate. The MOSgate structure usually consists of thin gate oxide and a conductive polysilicon gate overlying the oxide and atop the invertible channel regions.

Such structures are shown in copending Ser. No. 09/038,453 filed Mar. 11, 1998 (IR-1455). It is desirable in such structures to bring the stripes close together to increase their density and, thus the channel width per unit area. The space needed to make electrical contact from the source electrode to the source and base region of each base strip requires a minimum possible base strip spacing. It is known to make a remote source/base contact to enable a closer packing of trench topology type strips, as shown for example in copending application serial no. (Not Yet Filed) (IR-1461). It is also known to use a planar topology strip arrangement with a non-linear shape to create closely spaced strip sections with intermittent widely spaced contact sections, as shown in U.S. Pat. No. 5,703,389, dated Dec. 30, 1997. That arrangement, however, restricts polysilicon gate current to flow along the axis of the strips.

It is also known to use, enlarged base regions for contact to base strips having narrow segments, as in U.S. Pat. Nos. 4,833,513 and 5,521,410, but these do not provide a minimized spacing between narrow base segments.

It would be desirable to provide a planar topology strip base design for MOSgated devices to increase channel width per unit area while allowing the polysilicon gate charging current to flow in any axis.

BRIEF DESCRIPTION OF THE INVENTION

In accordance with the present invention, a plurality of interrupted relatively short polysilicon strips of zig-zag overall planar configuration are provided to produce the improved packing effect of the long zig-zag polysilicon strips of U.S. Pat. No. 5,703,389, without however, having the high polysilicon gate resistance of the structure of the U.S. Pat. No. 5,703,389. More specifically, a novel cell structure is provided, consisting of a base having two narrow oppositely directed extensions from a central laterally enlarged contact section. A source is disposed within each cell, to define an invertible channel area at the periphery of each base. A plurality of such elongated cells are spaced from one another along a row, in which the parallel cells of a adjacent rows have their lateral central extensions located adjacent the spaces between the ends of the cells of the adjacent rows.

A source/base contact is then made in the laterally enlarged areas of each of the cells making it possible to very closely space their narrow elongated extensions to obtain increased cell packing and to maximize the channel width per unit area of the die.

DETAILED DESCRIPTION OF THE DRAWINGS

Figure 1:
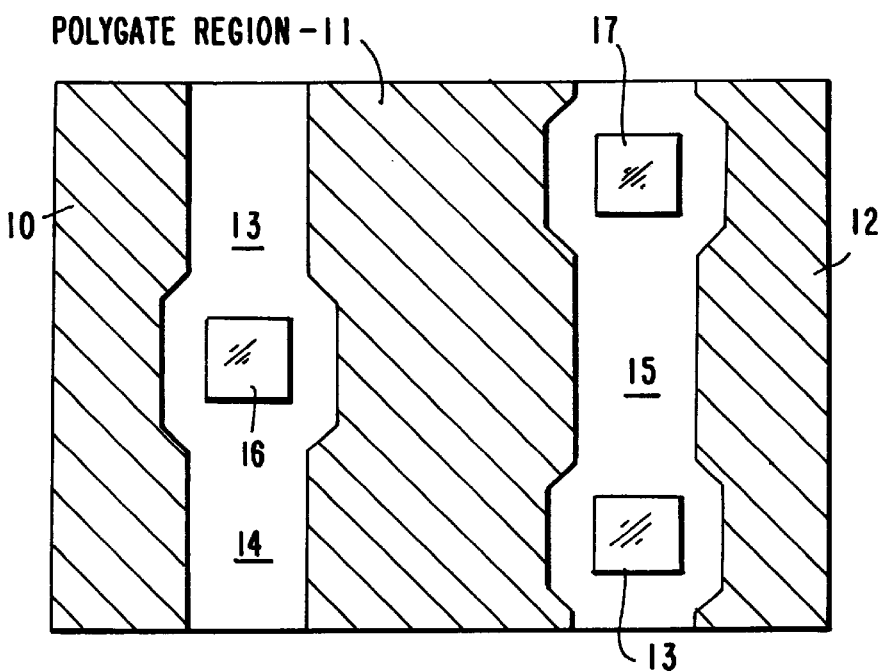
FIG. 1 is a top view to schematically show a prior art non linear strip design.

Referring first to FIG. 1, there is shown a non-linear planar polysilicon strip design of the kind disclosed in U.S. Pat. No. 5,703,389. Thus, when seen from the top of the polysilicon layer level, there are shown portions of three elongated parallel rows of polysilicon strips 10, 11 and 12 overlying related base and source regions (not shown) which are formed, using the polysilicon pattern as a diffusion mask. Strips 10, 11 and 12 define closely spaced strip region portions, such as regions 13, 14 and 15 and enlarged contact regions 16, 17 and 18. The strips 10, 11 and 12 are narrow, with no interconnections except at the ends and, therefore, can only be charged along the axis of the strips.

FIGS. 2 to 5 show the novel cell structure of the present invention which employs the closely spaced strips of the prior art to reduce the $R_{DSON}$ of a given die, but having connections between strips and longer sections of strips that are closely spaced.

Figure 3:
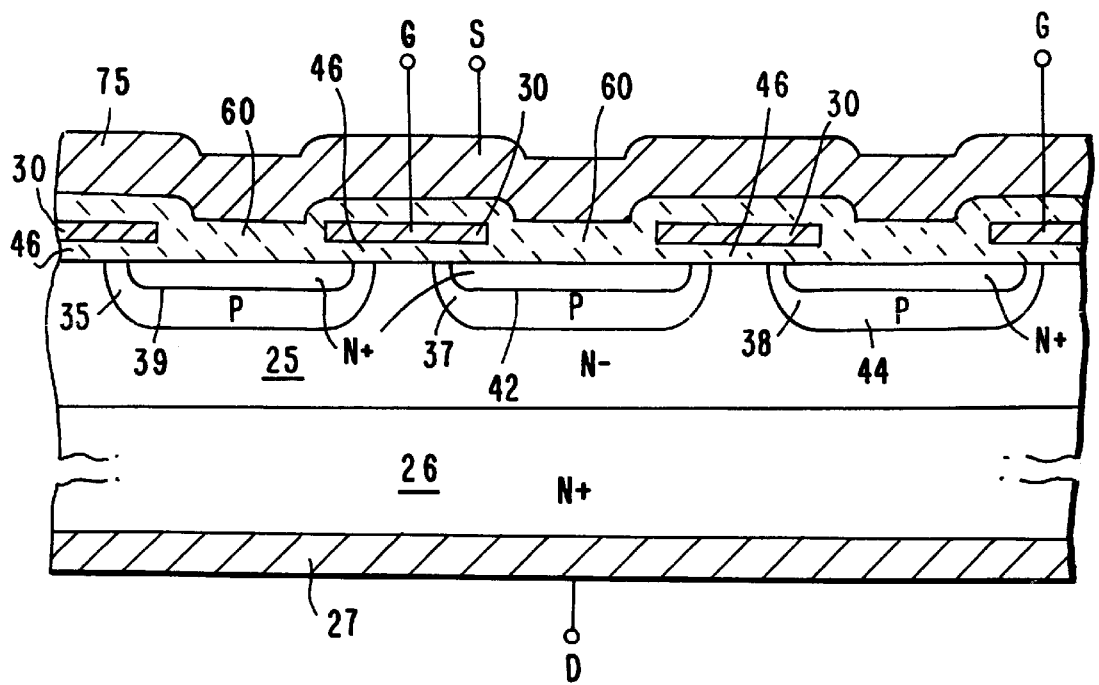
FIG. 3 is a cross-section of FIG. 2 taken across section-line 3—3 in FIG. 2.

Referring to FIGS. 2 to 5, there is shown a very small segment of a single die which may contain many thousands of cells identical to those to be described and which are formed in an N⁻ epitaxially deposited layer 25 of monocrystalline silicon, deposited atop a silicon substrate 26. A drain electrode 27 is connected to the bottom of wafer 26 (FIG. 3).

FIGS. 2 to 5 show short portions of three parallel rows of cells of a larger number of identical defined by openings in a continuous sheet of polysilicon 30. Four identical cells 31, 32, 33 and 34 are shown which contain elongated P type base diffusions 35, 36, 37 and 38 respectively (FIGS. 3, 4 and 5) in the epitaxial layer 25. Each of the bases are contained in parallel rows, with base 35 being in a first row, and aligned with a plurality of other identical bases, not shown; bases 36 and 37 being in a second row and base 38 being in a third and parallel row.

Figure 4:
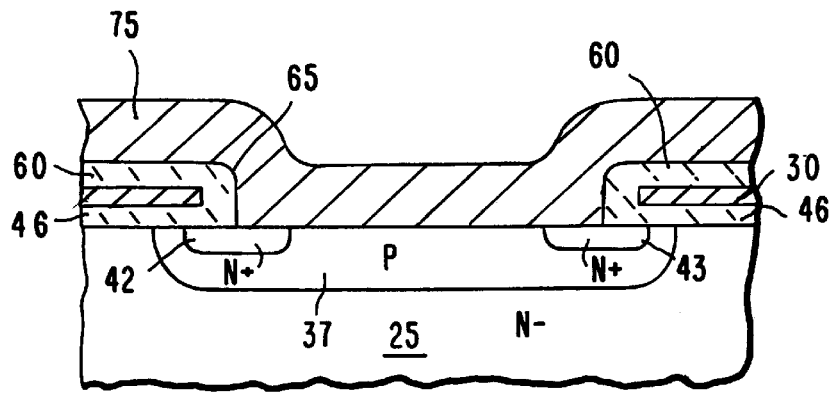
FIG. 4 is a cross-section of FIG. 2 taken across section-line 4—4 in FIG. 2.
Figure 5:
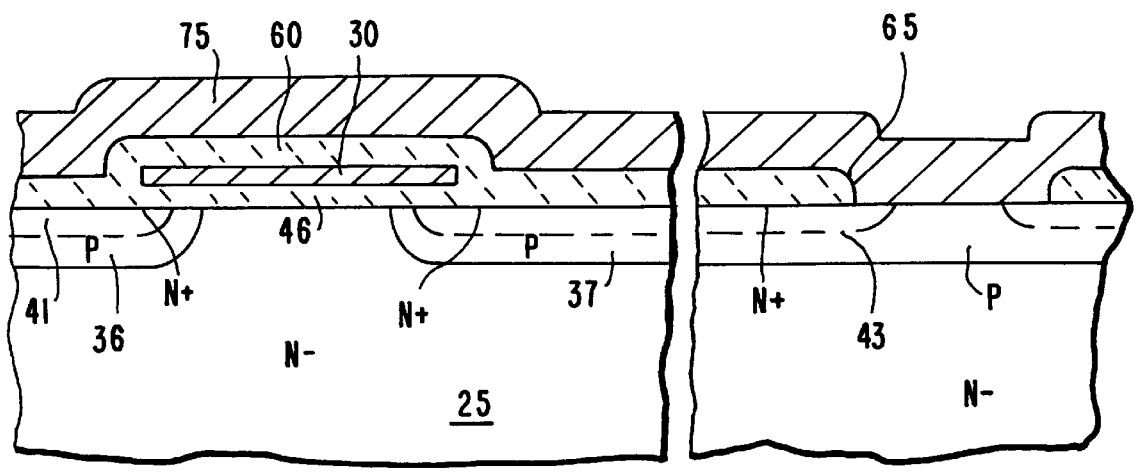
FIG. 5 is a cross-section of FIG. 2 taken across section-line 5—5 in FIG. 2.

Each of the bases 35 to 38 contain respective N type source diffusions. Thus, as shown in FIGS. 3, 4 and 5, base 35 has source diffusion 39; base 36 has a similar N⁺ source region, of which only region 41 is shown in FIG. 5; base 37 has source region 42 and base region 38 has source region 44. The space between the source regions and the periphery of the base diffusions define invertible channels which are covered by gate oxide 46 and polysilicon 30. It will be apparent that the openings or windows 50 to 53 in polysilicon layer 30 service as the mask boundaries for the diffusion of the P type base regions and N type source regions. It will also be apparent that the conductivity types can be reversed, if desired.

As shown in FIGS. 3, 4 and 5, after forming the diffusions to define base and source regions, the polysilicon 30 can be overcoated with a low temperature oxide (LTO) layer 60. Contact windows, such as window 65 in FIGS. 4 and 5 are then opened photolithographically in LTO layer 60 and any other layers present to expose the N⁻ layer 25 and the P base and N⁺ source diffusions of each cell.

The P bases 35, 37 and 38 each have laterally enlarged central regions 70, 71 and 72 respectively. These large area base regions are sufficiently large to receive the source/base contact from source aluminum electrode 75 as shown in FIGS. 4 and 5.

Figure 4A:
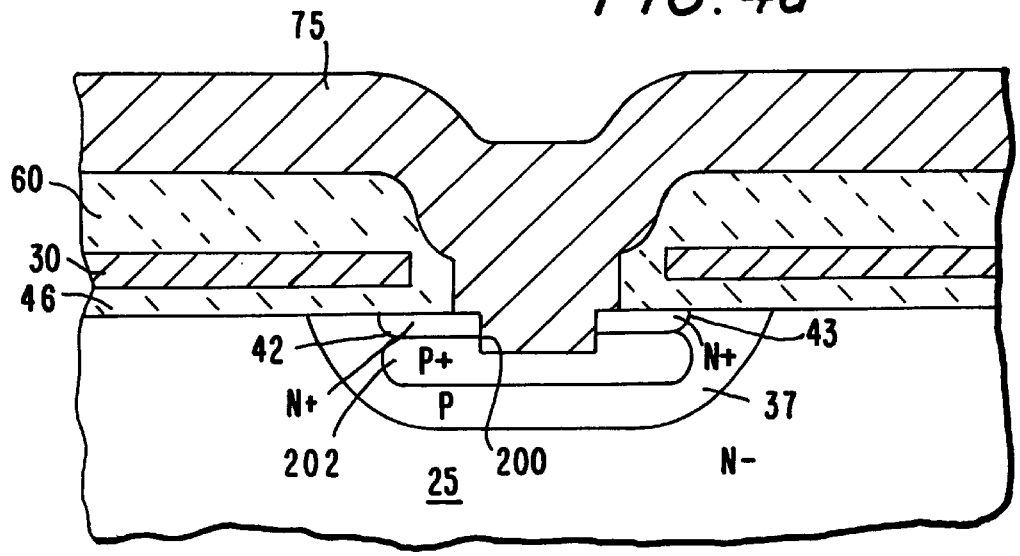
FIG. 4a is a cross-section of FIG. 2 taken across section-line 3—3 in FIG. 2 for a modified source contact structure.

Other contact structures can be used including that shown in FIG. 4a. Thus, a structure can be made using an oxide etch, a shallow silicon etch, and a second oxide etch to create a contact to both source and base as disclosed in U.S. Pat. No. 5,795,793 (IR-1113). Thus, in FIG. 4a, all elements which are similar to those of FIG. 4 have the same identifying numeral. However, a shallow trench 200 is etched into the silicon surface and a P+ contact diffusion 202 is added atop P channel region 37. The source contact then makes good contact to source regions 42, 43 and to P+ region 202 and base 200. Each individual cell is contacted in this way.

The narrow oppositely directed legs of each base is then closely spaced to the narrow leg of an adjacent cell. The enlarged base region sections 70, 71 and 72 nest into the space between spaced cells in adjacent rows. Thus, the novel invention makes it possible to have very closely spaced base strip sections, and to have enlarged contact regions, but, because the polysilicon 30 is a continuous sheet, it allows gate charging current to flow in all directions.

Figure 2:
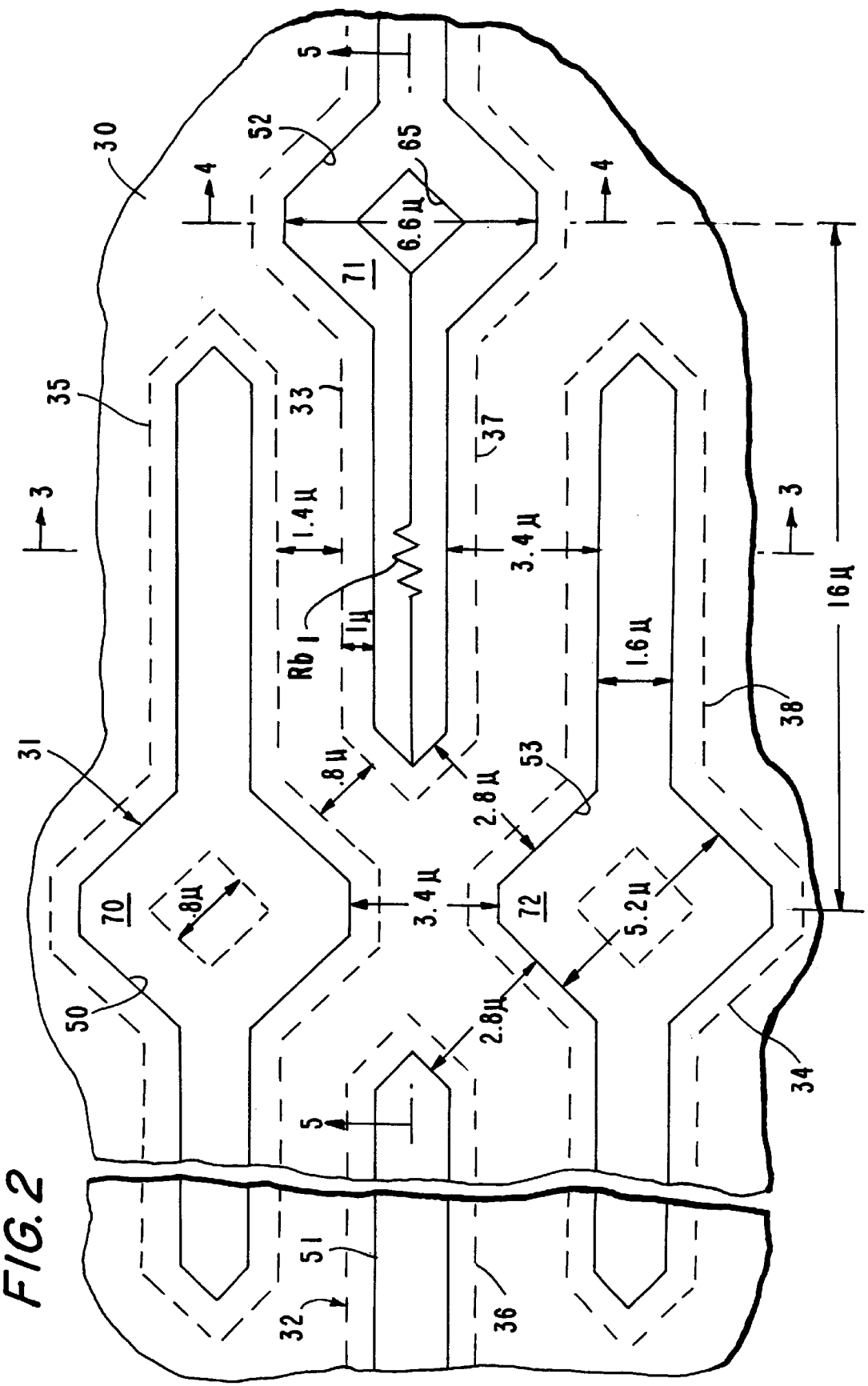
FIG. 2 is a top view of the topology of the novel cell structure of the present invention.

In one embodiment of the invention, the dimensions selected for each cell were these shown in FIG. 2. Thus, the space between adjacent bases is about 1.4 microns along the length of the legs and about 0.8 microns from a laterally enlarged contact area to an adjacent strip end.

Note that the enlarged base areas are truncated or "offset" because of the truncated diffusion window openings, which may have a dimension of 6.6 microns, shown for polysilicon the enlarged opening in window 52. A rectangular contact and about 1.8 microns can be used in the central enlarged region of each cell.

Figure 8:
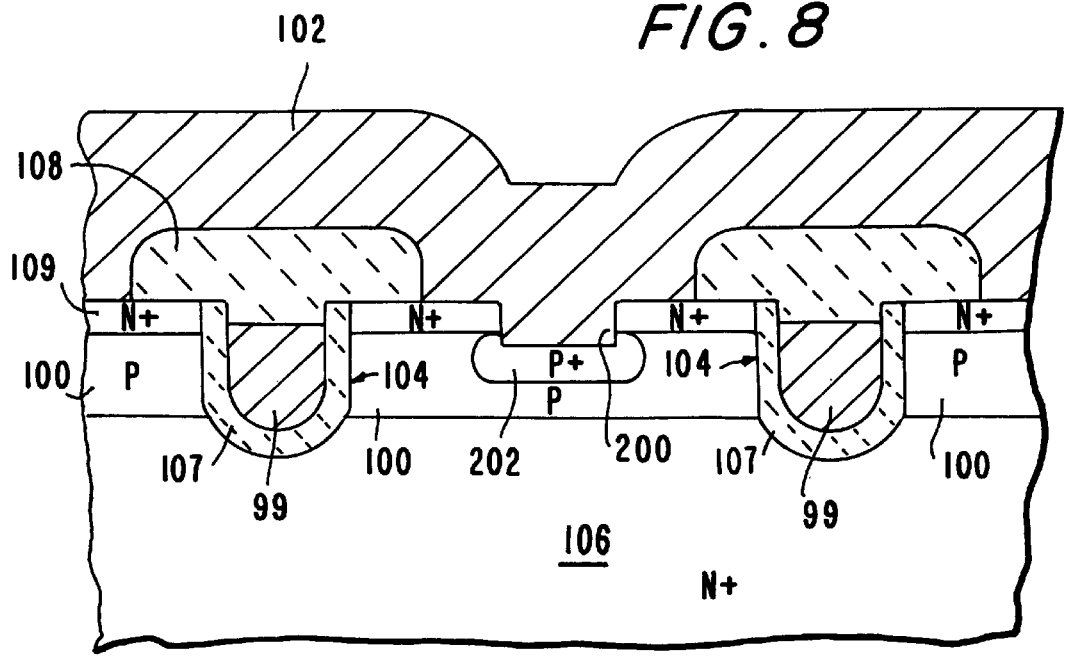
FIG. 8 is a cross-section of FIG. 6 taken across section-line 8—8 in FIG. 6.
Figure 6:
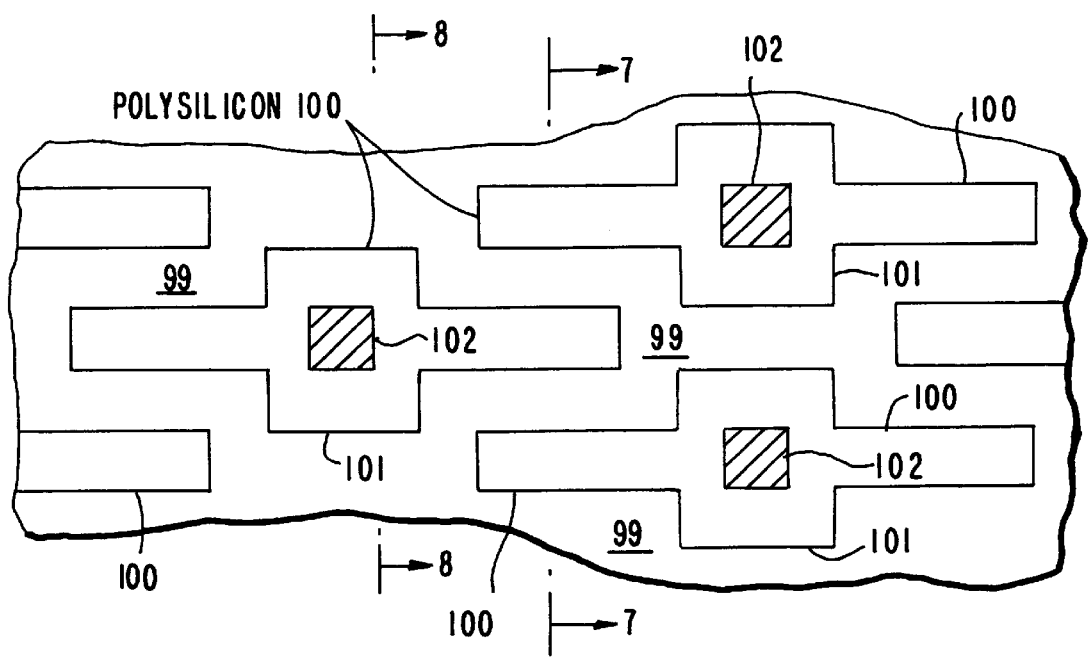
FIG. 6 is a top view of the present invention when carried out with trench-type technology.
Figure 7:
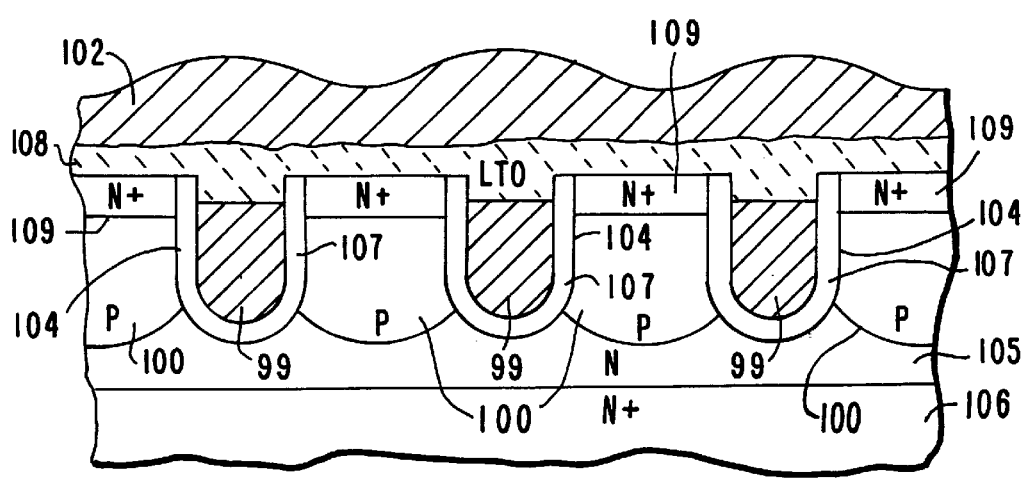
FIG. 7 is a cross-section of FIG. 6 taken across section-line 7—7 in FIG. 6.

Note that the concept of the present invention can also be carried out in a trench type technology device. Thus, as shown in FIGS. 6, 7 and 8 a plurality of elongated base regions 100 having centrally enlarged sections 101 provide for a remote source contact 102 to a sheet source electrode. A shown best in FIG. 7, each of sections 101 are comprised of polysilicon 99 deposited in grooves 104 in N type epitaxial silicon layer 105 which is deposited on N+ substrate 106. A gate oxide 107 lines each of grooves 104. A low temperature oxide 108 covers the surface of layer 105 and is penetrated by the source contacts 102 as shown in FIG. 6. Source regions 109 extend along the upper edges of gate oxide 104 in the usual manner.

FIG. 8 shows the manner in which contact is made to the source and base regions. Thus, a contact of the kind shown in FIG. 4a is used, in which the source electrode 102 fills the etched region 200 to contact source regions 109 and base region 100 through P+ contact region 202.

In FIGS. 6 and 7, the polysilicon gate is continuous throughout so that charging current can flow in all axes, as in the case of the planar embodiment.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A cell structure for a power MOSFET; said cell structure comprising an elongated base diffusion of one conductivity type in a substrate of the other conductivity type; an elongated source diffusion of the other conductivity type formed within said base diffusion and being substantially coextensive therewith; the area between the outer periphery of said source diffusion and the outer periphery of said base diffusion defining an invertible channel region of substantially constant width; a gate insulation layer overlying at least portions of said invertible channel region; a gate electrode layer overlying said gate insulation layer; said base diffusion having first and second aligned elongated straight sections and a central laterally enlarged section disposed between and continuous with said straight sections; said first and second section being relatively narrow with respect to said laterally enlarged central section for their full length and to the opposite respective ends of said elongated base diffusion; and a source contact connected to said base and source diffusions at said laterally enlarged central section.

2. The cell structure of claim 1 wherein said gate insulation layer is a silicon dioxide layer and wherein said gate electrode layer is conductive polysilicon.

3. The cell structure of claim 2 wherein said one conductivity type is P.

4. The cell structure of claim 1 wherein said laterally enlarged section is located in the center of said elongated base diffusion.

5. The cell structure of claim 2 wherein said laterally enlarged section is located in the center of said elongated base diffusion.

6. The cell structure of claim 3 wherein said laterally enlarged section is located in the center of said elongated base diffusion.

7. The cell structure of claim 1 wherein the width of said elongated straight sections is about 3.6 microns and the width of said laterally enlarged section is about 8.6 microns.

8. The cell structure of claim 4 wherein the width of said elongated straight sections is about 3.6 microns and the width of said laterally enlarged section is about 8.6 microns.

9. The cell structure of claim 8 wherein said gate insulation layer is a silicon dioxide layer and wherein said gate electrode layer is conductive polysilicon.

10. The cell structure of claim 9 wherein said one conductivity type is P.

11. The cell structure of claim 1, wherein said first and second section each have parallel spaced side edges which taper to respective points at the ends of said sections.

12. A MOSgated device comprising, a semiconductor substrate having an epitaxially deposited junction receiving layer thereon; a plurality of separate identical MOSFET cells formed in said substrate and being arranged in a plurality of parallel laterally spaced rows each which contains a plurality of longitudinally spaced cells;

each of said cells comprising an elongated base diffusion of one conductively type in said junction receiving layer which is of the other conductivity type, an elongated source diffusion of the other conductivity type formed within said base diffusion and being substantially coextensive therewith; the area between the outer periphery of said source diffusion and the outer periphery of said base diffusion defining an invertible channel region of substantially constant width; said base diffusion having first and second elongated straight sections and a central laterally enlarged section disposed between and continuous with said straight sections;

said first and second sections being relatively narrow, with respect to said laterally enlarged central section, for their full length and to the opposite respective ends of said base diffusion;

a gate insulation layer overlying at least portions of each of said invertible channel regions and a gate electrode layer overlying said gate insulation layer; and a conductive source contact layer overlying and insulated from said gate electrode layer; said conductive source contact being connected to each of said source and base diffusions only at said laterally enlarged sections of each of said cells; said gate electrode layer being continuous in both a lateral and a longitudinal direction relation to the direction of elongation of said cells.

13. The device of claim 1 wherein said gate insulation layer is silicon dioxide layer and wherein said gate electrode layer is conductive polysilicon.

14. The device of claim 13 wherein said one conductivity type is P.

15. The device of claim 12 wherein said laterally enlarged section of each of said cells of each of said rows is laterally adjacent to the longitudinal space between adjacent cells in an adjacent row, whereby each of said cells of said rows are nested to provide a reduced spacing between their said narrow elongated straight sections.

16. The device of claim 15 wherein said gate insulation layer is a silicon dioxide layer and wherein said gate electrode layer is conductive polysilicon.

17. The device of claim 16 wherein said one conductivity type is P.

18. The device of claim 12 wherein said laterally enlarged section of each of said cells is located centrally between its elongated straight sections.

19. The device of claim 15 wherein said laterally enlarged section of each of said cells is located centrally between its elongated straight sections.

20. The device of claim 19 wherein said gate insulation layer is a silicon dioxide layer and wherein said gate electrode layer is conductive polysilicon.

21. The device of claim 13 wherein said one conductivity type is P.

22. The device of claim 12 wherein the width of said elongated straight sections is about 3.6 microns and the width of said laterally enlarged section is about 8.6 microns.

23. The device of claim 15 wherein the width of said elongated straight sections is about 3.6 microns and the width of said laterally enlarged section is about 8.6 microns.

24. The device of claim 15 wherein the diagonal spacing between the end of the narrow elongated section of one row to the laterally enlarged section of an adjacent cell in and adjacent row is about 0.8 microns.

25. The device of claim 24 wherein the diagonal spacing between the end of narrow elongated section of one row to the laterally enlarged section of an adjacent cell in and adjacent row is about 0.8 microns.

26. The device of claim 25 wherein the longitudinal center-to-center spacing of said laterally enlarged sections of adjacent cells in adjacent rows is about 16 microns.

27. The device of claim 26 wherein said laterally enlarged regions are offset.

28. The device of claim 12, wherein said first and second sections of each of said cells have parallel spaced side edges which taper to respective points at the ends of each of said cells.

* * * * *